(12) United States Patent
Fuhrmann et al.

(10) Patent No.: US 6,882,556 B2
(45) Date of Patent: Apr. 19, 2005

(54) SEMICONDUCTOR MEMORY HAVING A CONFIGURATION OF MEMORY CELLS

(75) Inventors: Dirk Fuhrmann, München (DE); Reidar Lindstedt, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/631,355

(22) Filed: Jul. 31, 2003

(65) Prior Publication Data

US 2004/0022100 A1 Feb. 5, 2004

(30) Foreign Application Priority Data

Jul. 31, 2002 (DE) .......................... 102 34 945

(51) Int. Cl.⁷ .............................................. G11C 5/06
(52) U.S. Cl. ............................................. 365/63; 365/51
(58) Field of Search .............................. 365/63, 51, 69

(56) References Cited

U.S. PATENT DOCUMENTS

| | | | |
|---|---|---|---|
| 4,959,698 A | * 9/1990 | Shinichi ..................... | 257/296 |
| 5,691,934 A | 11/1997 | Douglass ..................... | 365/149 |
| 5,736,761 A | 4/1998 | Risch et al. ................. | 257/301 |
| 6,118,683 A | 9/2000 | Kunkel et al. ................ | 365/63 |
| 6,448,600 B1 | 9/2002 | Schlosser et al. ........... | 257/302 |
| 2004/0135190 A1 | * 7/2004 | Lindstedt et al. ........... | 257/314 |
| 2004/0141361 A1 | * 7/2004 | Tsukikawa et al. ......... | 365/149 |
| 2004/0156255 A1 | * 8/2004 | Tsukikawa .................. | 365/206 |

FOREIGN PATENT DOCUMENTS

| | | |
|---|---|---|
| DE | 199 54 867 C1 | 12/2000 |
| EP | 0 744 772 A1 | 11/1996 |
| WO | 02/47159 A2 | 6/2002 |

* cited by examiner

*Primary Examiner*—Richard Elms
*Assistant Examiner*—Hien Nguyen
(74) *Attorney, Agent, or Firm*—Laurence A. Greenberg; Werner H. Stemer; Ralph E. Locher

(57) ABSTRACT

A semiconductor memory has a novel geometry of a memory cell array. Without reducing the distance between storage capacitors that are the most closely adjacent to one another it is possible to structure additional lines between adjacent lines in particular word lines. In a preferred embodiment, the number of word lines required for the number of memory cells remaining the same is reduced, as a result of which word line drivers are saved and substrate area is gained.

11 Claims, 3 Drawing Sheets

FIG 1 PRIOR ART
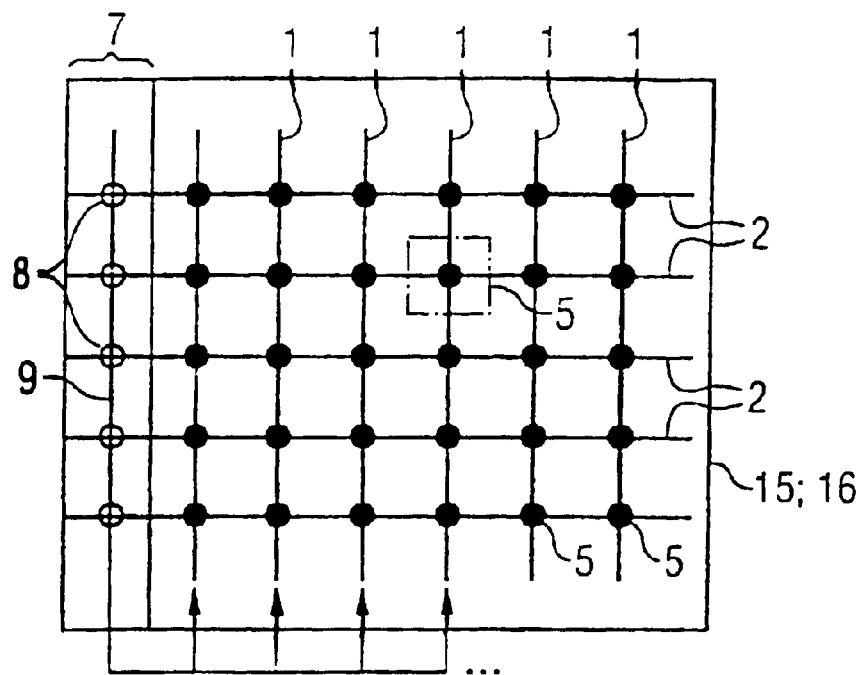
PRIOR ART  FIG 2
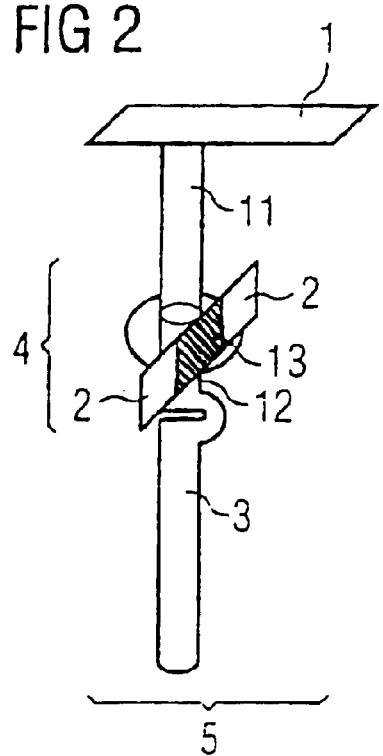

SEMICONDUCTOR MEMORY HAVING A CONFIGURATION OF MEMORY CELLS

BACKGROUND OF THE INVENTION

Field of the Invention

The invention relates to a semiconductor memory having a configuration of memory cells which are connected to first lines, which run parallel to one another, and to second lines, that run parallel to one another and perpendicular to the first lines. Each of the memory cells has a storage capacitor and a vertical selection transistor. Within the configuration of memory cells, a memory cell is connected to each crossover point between a first line and a second line. In particular, dynamic random access memories (DRAMs) or other volatile semiconductor memories are constructed in this way. They have a memory cell array, whose memory cells each have a storage capacitor for storing charges and a selection transistor. Each memory cell is addressed by a first line (for example a bit line) and a second line (e.g. a word line) running perpendicular to the first line over the semiconductor substrate. By altering the electrical potentials on the first and/or the second line, it is possible to switch the selection transistor, so that a certain quantity of charge can flow into or out of the storage capacitor.

Selection transistors are usually configured as metal oxide semiconductor field-effect transistors (MOSFETs), the first source/drain electrode of which is connected to a bit line and the gate electrode of which is connected to a word line. The second switch/drain electrode leads to the storage capacitor. In view of the increasing integration density of future semiconductor memories, the selection transistors are preferably configured as vertical transistors whose two source/drain electrodes are disposed one above the other vertically with respect to the substrate surface. As a result, the selection transistor requires only a minimal substrate base area. In the case of vertical selection transistors the gate electrode is disposed in a manner only slightly offset laterally and at a central level between the two source/drain electrodes of the transistor. Planar selection transistors by contrast, whose electrodes are disposed laterally next to one another on the substrate surface require a significantly larger substrate base area.

Despite the use of vertical selection transistors, the integration density of a semiconductor memory cannot be increased arbitrarily since a minimum width of bit lines and word lines is necessary on account of defraction phenomena during lithographic patterning and since, moreover, the storage capacitor for example a trench capacitor, requires a certain substrate base area in order to be able to store sufficiently high quantities of charge. Although the storage capacitors that are usually configured in the form of a deep trench have a very high aspect ratio and extend very deep into the substrate, leakage currents nonetheless lead to a rapid escape of stored quantities of charge precisely in the case of volatile semiconductor memories, so that, in order to increase the capacitance, the largest possible base area is chosen for a buried storage capacitor in the lateral direction as well. Therefore, the base area of the trench capacitors concomitantly determines the integration density of a semiconductor memory.

In the cell array of a semiconductor memory, storage capacitors are disposed, with regard to the base area of the semiconductor substrate, in direct proximity to the crossover point between the bite line and the word line that address the relevant memory cell. In accordance with the network-type configuration of mutually parallel bit lines and mutually parallel word lines running perpendicular to the bit lines over or in the substrate base area, the memory cells and thus also the storage capacitors are disposed for example in chessboard-like fashion on the substrate. Terminals for the word lines crossing the bit lines are provided at at least one edge of the cell array. In a real cell array architecture, by contrast, the bit lines no longer cross all the word lines, but rather only some of them, in order to keep down the bit line capacitance and to facilitate a read-out of an item of information from a memory cell. Various groups of word lines therefore cross different groups of bit lines, so that a plurality of cell blocks are produced instead of a single cell array. Word lines and bit lines require complicated driver circuits, i.e. word line drivers or evaluation circuits for bit lines. Conventionally, the size and number of these circuits can be altered only if the number of word and bit lines is simultaneously altered.

In a conventional semiconductor memory, the widths of the bit and word lines and their distances from one another are chosen to be as small as possible in accordance with the wavelength used for the lithographic exposure. The trench capacitors are made as wide as possible in order to be able to store large quantities of charge. In order to utilize the available substrate base area in the best possible manner, a memory cell, that is to say a storage capacitor, is provided in direct proximity at each crossover point between a bit line and a word line. In order to read out stored information, provision is made of evaluation circuits e.g. with dummy cells in order to be able to assign a read-out memory information item to a digital value zero or one.

With the configuration of memory cells at each crossover point between the bit line and the word line in a conventional semiconductor memory described above, it is no longer possible to accommodate further structures in the cell array between the mutually adjacent bit lines or mutually adjacent word lines, since their distance from one another and their width have already been optimized in accordance with the respective optical resolution limit.

SUMMARY OF THE INVENTION

It is accordingly an object of the invention to provide a semiconductor memory having a configuration of memory cells that overcomes the above-mentioned disadvantages of the prior art devices of this general type, in which, without altering the lateral distance between adjacent storage capacitors, it is possible to form additional structures, for instance control lines between adjacent first or second lines. Furthermore, the object of the invention is to alter the number of memory cells which are addressed in a connected manner per word line or per bit line, and thus to create the potential for saving area on the semiconductor substrate.

With the foregoing and other objects in view there is provided, in accordance with the invention, a semiconductor memory. The memory contains first lines running along in a first direction, second lines running along in a second direction and crossing the first lines, and a configuration of memory cells connected to the first lines and to the second lines. Each of the memory cells has a storage capacitor and a vertical selection transistor. The memory cells are each connected at crossover points between one of the first lines and one of the second lines. Each of the second lines connects together the memory cells whose storage capacitors are disposed alternately on both sides of a respective second line in a manner laterally offset relative to the respective second line.

In the case of the semiconductor memory of the type mentioned in the introduction, the object is achieved by virtue of the fact that each of the second lines connects together memory cells whose storage capacitors are disposed alternately on both sides of the respective second line-in a manner laterally offset relative to the respective second line.

According to the invention, the storage capacitors are disposed in the form of a grid in which, unlike conventional practice, capacitors that are the most closely adjacent to one another are not offset with respect to one another in the direction of a bit line or a word line, but rather obliquely, preferably diagonally with respect to the course of the directions. The distance between the storage capacitors that are most closely adjacent to one another is intended to remain unchanged since it has a determining influence on the cell spacing. The diagonal configuration of trench capacitors that are most closely adjacent to one another enables a novel geometry in the configuration of the memory cells. According to the invention, each of the second lines connects together memory cells whose storage capacitors are disposed alternately on both sides of the respective second line in a manner laterally offset relative to the respective second line. Whereas conventionally one row of memory cells is disposed centrally below a second line, according to the invention each individual line of the second lines is connected to memory cells whose storage capacitors are disposed alternately on the left of the line and on the right of the line in a laterally offset manner. In this manner, a single second line can be used to address two rows of memory cells whose storage capacitors are at the same distance from one another as in a conventional semiconductor memory. The number of second lines required can thus be reduced. Since the cell density has remained unchanged on account of the unchanged distance between storage capacitors that are the most closely adjacent to one another, the distances between the second lines are greater in the case of the semiconductor memory according to the invention that is conventionally the case. This has the advantage, on the first one hand, that fewer drivers are necessary for driving the second lines; on the other hand, insofar as is permitted by the lithographic resolution limit for the first and second lines, it is possible to arrange additional lines, for instance control lines or auxiliary lines, between mutually adjacent second lines. By way of example, it is conceivable to equip the word lines in each case with an additional parallel line in order to increase their conductivity. The number of drivers required for the second lines is not increased as a result.

In the semiconductor memory according to the invention, the number of memory cells that are connected to a word line or to a bit line is altered compared with a conventional semiconductor memory. The altered linear ratio of the two dimensions of the memory cell array achieved by virtue of the configuration according to the invention creates an additional potential for saving area on a semiconductor substrate. Moreover, an alteration—according to the invention—of the number of memory cells connected per word or bit line affords the possibility of optimizing the length and the capacitance of word lines and bit lines. By way of example, precisely in the context of decreasing feature sizes, circuits may be dimensioned for evaluating extremely weak signals. In conjunction with a reduction of the capacitor spacing itself, the configuration according to the invention affords more complex optimization possibilities.

It is preferably provided that any two-memory cells whose storage capacitors are the most closely adjacent to one another are always connected to two mutually adjacent first lines. Although the storage capacitors that are most closely adjacent to one another are connected to the same second line and are laterally offset with respect thereto in opposite directions perpendicular to the course of the second lines, the memory cells of these storage capacitors are still connected to different first lines, so that individual memory cells can be addressed.

It is preferably provided that any two memory cells which are connected to the same first line and whose storage capacitors are adjacent to one another along the first line are always connected to two mutually adjacent second lines, preferably ones that are the most closely adjacent to one another. Although every second line addresses two rows of memory cells, of which, by way of example, one row is disposed on the left of the line and the other row is disposed on the right of the line each memory cell of one of these rows is connected to a respectively different first line. Although two rows of memory cells always lie between adjacent second lines on account of the diagonally disposed chessboard-like pattern of storage capacitors that are the most closely adjacent to one another, the memory cells which are connected to the same first line and are adjacent along the first line are connected to second lines that are directly adjacent to one another.

It is preferably provided that mutually adjacent second lines are disposed in a manner offset with respect to one another by twice as large a distance as first lines that are the most closely adjacent to one another. This embodiment exploits the fact that the second lines which connect together two rows of memory cells according to the invention are required in a smaller number than in the case of a conventional semiconductor memory. As a result, it is possible to increase their distances from one another. Preferably, additional lines for instance control lines or auxiliary lines can be disposed between the second lines that are now disposed at a greater distance from one another. Provided that the distance between storage capacitors that are the most closely adjacent remains unchanged relative to a conventional semiconductor memory, the distance between the first lines is correspondingly reduced. For the first lines and their distance from one another, an additional reduction of the resolution limit is necessary in order to pattern the additional lines between the mutually adjacent second lines. The distance between the storage capacitors that are the most closely adjacent to one another remains unchanged however. In the case of a chessboard-like configuration of the memory cells with a square memory cell base area and a cell grid rotated diagonally, i.e. for instance through 45°, the distance between second lines that are the most closely adjacent is exactly twice as large as the distance between first lines that are the most closely adjacent; therefore, an additional line can in each case be patterned between the second lines.

It is preferably provided that the first lines are bit lines and the second lines are word lines. A single word line can then address twice as many memory cells per lines. This fits in very well with the trend toward making the bit line significantly shorter than the word lines anyway. In this way, cell blocks which have significantly more bit lines than word lines can be disposed on a rectangular base area whose edge ratio (the ratio of the edge lengths of the longer to the short edge) is significantly smaller than in the case of a conventional semiconductor memory.

It is preferably provided that the storage capacitors of the memory cells connected to a single word line are disposed alternately on one side of the word line and on the other side of the word line. Accordingly, the memory cells connected to a single word lines are offset alternately on the left and right with respect to the word line. Consequently, the word line runs in the center between two rows of memory cells that are both addressed by this single word line.

As an alternative, it is provided that the first lines are word lines and the second lines are bit lines. In this embodiment additional lines running parallel to the bit lines can be patterned between mutually adjacent bit lines.

It is preferably provided that storage capacitors that are the most closely adjacent to one another form a diagonal grid relative to the course of the first lines and relative to the course of the second lines. The distances between the word lines and between the bit lines are chosen such that they have different magnitudes for word lines and for bit lines, as a result of which the storage capacitors can be shifted such that their positions form a square diagonal grid with respect to the course of the word lines and of the bit lines.

The storage capacitors are preferably trench capacitors buried in a semiconductor substrate. The capacitors disposed in a deep trench are fabricated by a procedure in which first the capacitor dielectric is deposited into a deep trench, on the trench wall, and a filling is subsequently introduced as inner capacitor electrodes. The outer electrode is formed by an indiffused layer in the doped semiconductor substrate surrounding the deep trench.

As an alternative to this, film capacitors stacked above the semiconductor substrate may be provided.

The selection transistors are preferably MOSFETs; their gate electrodes are usually connected to the word lines. The upper source/drain electrodes of the vertical selection transistors are connected to the bit lines; the lower source/drain electrodes are conductively connected to the inner electrode of the capacitor.

The semiconductor memory is preferably a volatile semiconductor memory, in particular a DRAM.

Other features which are considered as characteristic for the invention are set forth in the appended claims.

Although the invention is illustrated and described herein as embodied in a semiconductor memory having a configuration of memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, plan view of a semiconductor memory;

FIG. 2 is a cross-sectional view through a memory cell of the semiconductor memory;

DESCRIPTION OF THE PREFERRED EMBODIMENTS

Figure 3:
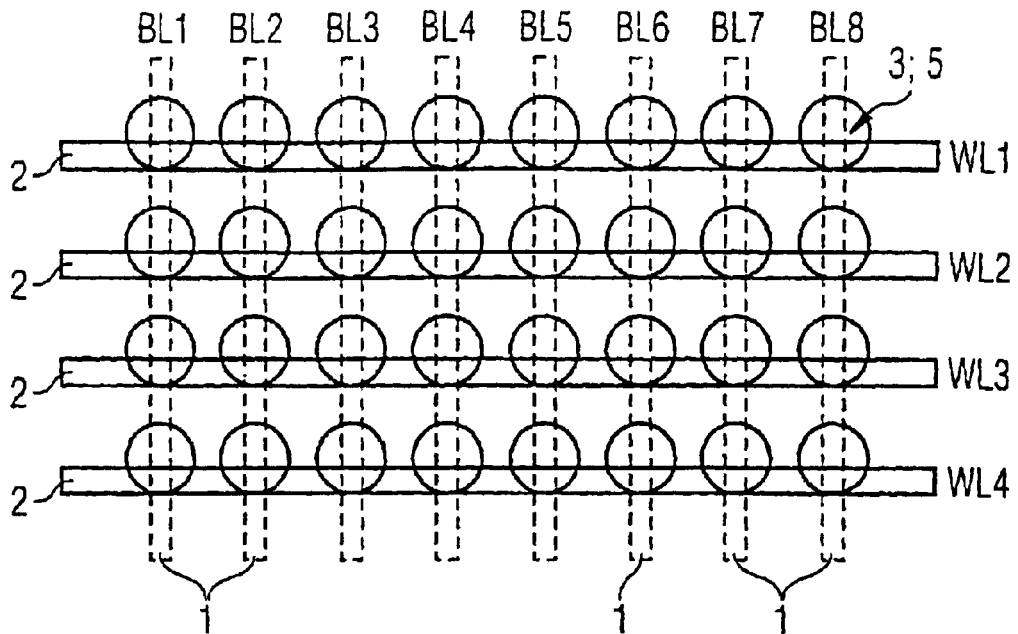
FIG. 3 is a plan view of a conventional semiconductor memory.

Referring now to the figures of the drawing in detail and first, particularly, to FIG. 1 thereof, there is shown a semiconductor memory having a multiplicity of memory cells 5, which are connected to one another in a row wise fashion by first lines, for instance bit lines 1, and second lines for instance, word lines 2. An evaluation circuit region 7 is illustrated schematically outside a memory block 15. The evaluation circuit 7 evaluates a signal read from a memory cell as a digital 1 or 0 and may have, for example, a dummy bit line 9 with dummy memory cells 8. When reading from a memory cell 5, it is possible to effect the evaluation of the read-out quantity of charge with a digital bit value for example by the comparison with a data value read from a dummy cell 8. In this case, a non-illustrated evaluation unit drives the dummy bit line 9 and the respective driving bit line 1.

FIG. 2 shows the typical construction of a memory cell, which has a storage capacitor disposed in a deep trench, i.e. a trench capacitor 3. In the trench, a selection transistor 4 of the memory cell 5 is disposed above the storage capacitor 3. If the selection transistor 4 is a MOSFET, it has an upper and a lower source/drain electrode 11, 12, between which a channel region is disposed. A word line 2, forming a gate electrode of the selection transistor 4, runs laterally beside the channel region. A thin insulator layer is disposed between the gate electrode and the channel region; through electrical induction it is possible to form a channel that opens the transistor and charges or discharges the capacitor 3.

The upper electrode 11 is connected to a bit line 1 running perpendicular to the word line 2 over the substrate surface.

A semiconductor memory has a large number of the memory cell illustrated in the cross-sectional view in FIG. 2. FIG. 3 shows a schematic plan of a conventional semiconductor memory whose bit lines 1 and word lines 2 cross one another. The memory cell 5 in accordance with FIG. 2 or in a different embodiment known from the prior art is disposed at each point of intersection. In the case of trench capacitors, the storage capacitors 3 are usually situated centrally below the respective word line or always offset in the same direction (upward in FIG. 3) with respect to the word line 2.

Figure 4:
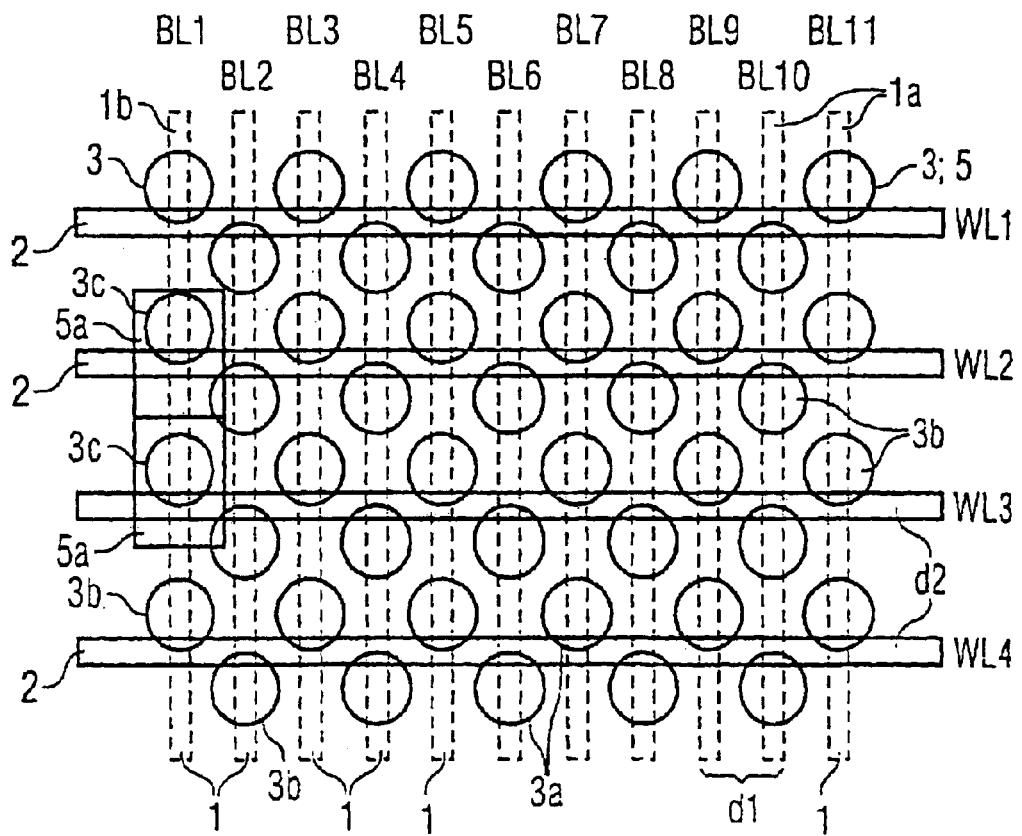
FIG. 4 is a plan view of a first embodiment of the semiconductor memory according to the invention.

FIG. 4 shows a schematic plan of a semiconductor memory according to the invention in a first embodiment, in which the first lines are bit lines 1 and the second lines are word lines 2. The semiconductor memory has a grid of storage capacitors 3 in which the path between the trench capacitors 3 that are the most closely adjacent to one another is rotated through 45° with respect to the course, i.e. the direction, of the bit lines 1 and word lines 2, but is of the same size in terms of its magnitude as in FIG. 3. Therefore, the memory cell density is of the same size as in FIG. 3. However, the way in which the memory cells 5 are connected up to one another is different in the two figures. In FIG. 4, each word line 2 is connected to two rows of memory cells 5 parallel to the word line. The memory cells 5 connected to a single word line 2 in each case are disposed in the form of a zigzag line alternately above and below the word line 2 in FIG. 4, i.e., with regard to the substrate surface, on the left and on the right of the word line 2 in a manner offset with respect thereto, as a result of which, with the quantity of word lines remaining the same, a word line can address more memory cells than in the case of a conventional semiconductor memory. As in the case of a conventional semiconductor memory, in FIG. 4, too, two memory cells 5 which are connected to the same bit line 1*b* and are adjacent to one another along the bit line 1*b* are connected to different word lines 2 that are the most closely adjacent to one another so that a preferably individual driving of in each case only a single memory cell is also possible with the semiconductor memory according to the invention. The storage capacitors 3c of the memory cells 5a connected to a single bit line are disposed in an offset manner either all on the right or all on the left of the word line. Consequently, storage capacitors 3a and 3b, respectively, that are the most closely adjacent to one another are always connected to two bit lines 1a that are the most closely adjacent. The grid dimension of the word lines 2 is twice as large as that of the bit lines 1, so that an additional line can in each case be patterned between the word lines in order, for example in the case of very long word lines, to increase the conductivity thereof.

Figure 5:
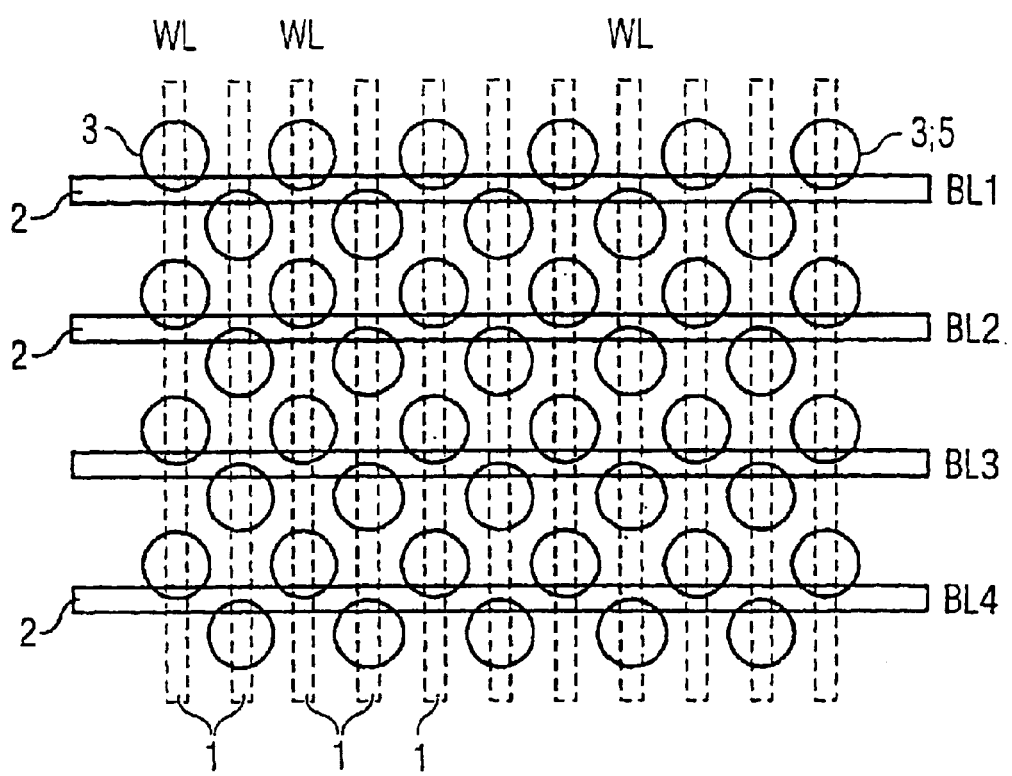
FIG. 5 is a plan view of a second embodiment of the semiconductor memory according to the invention.

FIG. 5 shows a further embodiment of the semiconductor memory according to the invention in schematic plan view, in which word lines and bit lines are interchanged with one another with regard to the configuration of the memory cells. Although the bit lines are still connected to the upper source/drain electrodes of the memory cells 5 and the word lines also still form the gate electrodes of the selection transistors, the bit lines are nonetheless connected to a larger number of memory cells 5 per bit line quantity in the case of the block of memory cells illustrated in FIG. 5 than in the case of a convention semiconductor memory in accordance with FIG. 3. The trench capacitors 3 are situated alternately on the right and on the left, i.e. offset upward and downward with respect to the bit line 2 in FIG. 5, so that each bit line 2 addresses two rows of memory cells. The word lines 1 are connected to a smaller number of memory cells.

Compared with the semiconductor memory in accordance with FIG. 4, the embodiment in accordance with FIG. 5 has the advantage that, given a predetermined number of memory cells to be connected to a bit line, the bit line can be made particular short. On the other hand, the embodiment in accordance with FIG. 4 has the advantage that only few word lines are required, so that only a small number of word line drivers are necessary as well, as a result of which base area is saved on the semiconductor substrate 16.

Reading from a semiconductor memory in accordance with FIG. 4 or FIG. 5 is affected with the aid of evaluation circuits as in a conventional semiconductor memory.

In particular, volatile semiconductor memories such as preferably DRAMs can be configured in the manner according to the invention.

We claim:

1. A semiconductor memory, comprising:
   first lines running along in a first direction;
   second lines running along in a second direction and crossing said first lines; and
   a configuration of memory cells connected to said first lines and to said second lines, each of said memory cells having a storage capacitor and a vertical selection transistor, each of said memory cells connected at each crossover point between one of said first lines and one of said second lines, each of said second lines connecting together said memory cells whose said storage capacitors are disposed alternately on both sides of a respective second line in a manner laterally offset relative to said respective second line.

2. The semiconductor memory according to claim 1, wherein any two of said memory cells whose said storage capacitors are most closely adjacent to one another are always connected to two mutually adjacent ones of said first lines.

3. The semiconductor memory according to claim 1, wherein any two of said memory cells which are both connected to a respective first line and whose said storage capacitors are adjacent to one another along said respective first line are always connected to two mutually adjacent ones of said second lines.

4. The semiconductor memory according to claim 1, wherein mutually adjacent ones of said second lines are disposed in a manner offset with respect to one another by twice as large a distance as said first lines that are most closely adjacent to one another.

5. The semiconductor memory according to claim 1, wherein said first lines are bit lines and said second lines are word lines.

6. The semiconductor memory according to claim 5, wherein said storage capacitors of said memory cells are connected to a single respective word line and are disposed alternately on one side of said respective word line and on another side of said respective word line.

7. The semiconductor memory according to claim 1, wherein said first lines are word lines and said second lines are bit lines.

8. The semiconductor memory according to claim 1, wherein said storage capacitors that are most closely adjacent to one another form a diagonal grid relative to a course of said first lines and relative to a course of said second lines.

9. The semiconductor memory according to claim 1, further comprising a semiconductor substrate and said storage capacitors are trench capacitors buried in said semiconductor substrate.

10. The semiconductor memory according to claim 5, wherein said selection transistors are MOSFETs having gate electrodes connected to said word lines.

11. The semiconductor memory according to claim 1, wherein the semiconductor memory is a dynamic random access memory.

* * * * *